US010326108B2

(12) United States Patent
Li et al.

(10) Patent No.: US 10,326,108 B2
(45) Date of Patent: Jun. 18, 2019

(54) DISPLAY PANEL AND REPAIRING METHOD THEREOF

(71) Applicants: BOE TECHNOLOGY GROUP CO., LTD., Beijing (CN); BEIJING BOE DISPLAY TECHNOLOGY CO., LTD., Beijing (CN)

(72) Inventors: Yanqiu Li, Beijing (CN); Hetao Wang, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/811,657

(22) Filed: Nov. 13, 2017

(65) Prior Publication Data

US 2018/0309087 A1 Oct. 25, 2018

(30) Foreign Application Priority Data

Apr. 25, 2017 (CN) .......................... 2017 1 0278685

(51) Int. Cl.
*H01L 51/52* (2006.01)
*H01L 51/56* (2006.01)

(52) U.S. Cl.
CPC ........ *H01L 51/5253* (2013.01); *H01L 51/524* (2013.01); *H01L 51/56* (2013.01); *H01L 2251/568* (2013.01)

(58) Field of Classification Search
None
See application file for complete search history.

(56) References Cited

FOREIGN PATENT DOCUMENTS

| CN | 103545448 | * | 1/2014 |
|---|---|---|---|
| CN | 106409873 A | | 2/2017 |

OTHER PUBLICATIONS

Jiang, H. et al. "Highly Flexible and Self-Healable Thermal Interface Material Based on Boron Nitride Nanosheets and a Dual Cross-linked Hydrogel," ACS Applied Materials & Interfaces; Published by American Chemical Society, Mar. 2, 2017; pp: 1-28.

Xing, L. et al. "Self-Healable Polymer Nanocomposites Capable of Simultaneously Recovering Multiple Functionalities," Advanced Functional Materials, 2016, 26, pp: 3524-3531.

Xing, Lixin, "Preparation of Aramid/BN Reinforcedself-healable Nanocomposites and Their Performance," Chinese Doctoral Thesis Full Text Database; Feb. 15, 2017; with partial English translation.

First Office Action dated Feb. 1, 2018, issued in counterpart Chinese Patent Application No. 201710278685.X; with partial English translation.

* cited by examiner

*Primary Examiner* — Asok K Sarkar
(74) *Attorney, Agent, or Firm* — McDermott Will & Emery LLP

(57) ABSTRACT

A display panel, includes a base layer and an OLED device layer which is positioned on the base layer. A material of the base layer includes hydrogenated boron nitride nanosheets.

20 Claims, 3 Drawing Sheets

H — B N B N H — 30 20 10 connected 30 20 10

Fig. 1
100
30
20
10
Fig. 2
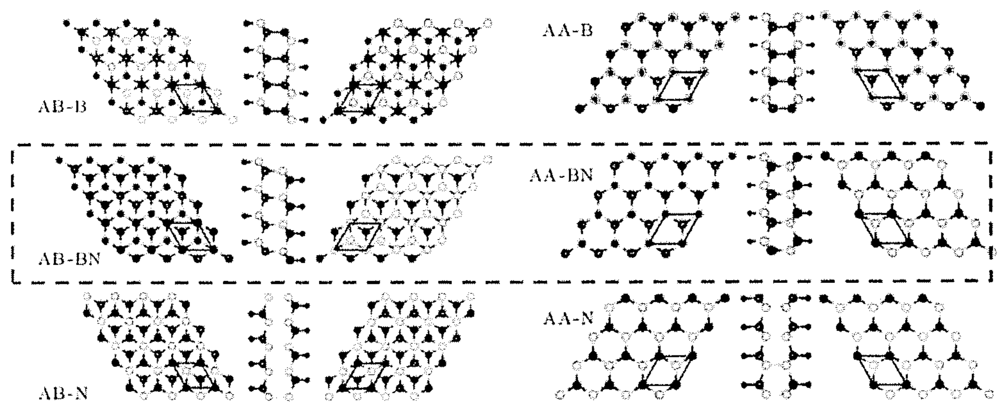
Fig. 3A
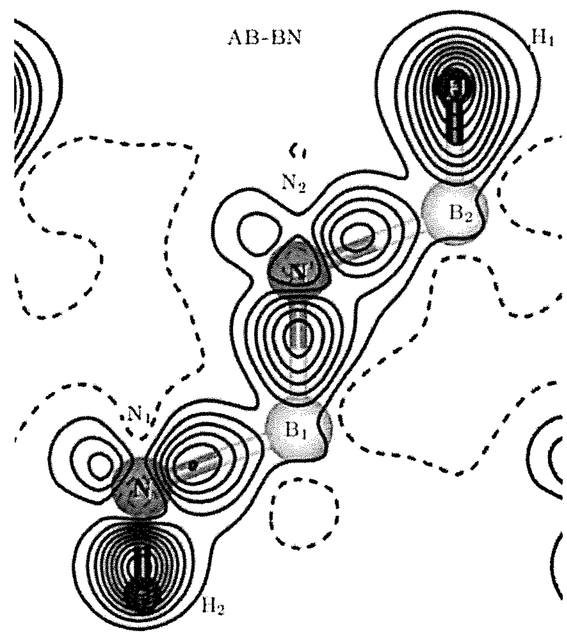

DISPLAY PANEL AND REPAIRING METHOD THEREOF

CROSS-REFERENCE TO RELATED APPLICATION

This application claims priority to Chinese Patent Application No. 201710278685.X, filed on Apr. 25, 2017, titled "DISPLAY PANEL AND REPAIRING METHOD THEREOF", which is incorporated herein by reference in its entirety.

TECHNICAL FIELD

The present disclosure relates to a display technology, more particularly, to a display panel and a repairing method thereof.

BACKGROUND

A flexible display panel easily becomes cracked when it is heavily bended. It is difficult to repair a cracked flexible display panel. A flexible display panel is not able to display properly at the cracking region, where its structures such as wirings etc., are broken. Accordingly, whole display quality of the product is affected.

SUMMARY

Embodiments of the present disclosure adopt the following technical solutions.

An aspect of the disclosure provides a display panel, comprising a base layer and an OLED device layer which is positioned on the base layer, wherein a material for the base layer comprises hydrogenated boron nitride nanosheets.

Optionally, the hydrogenated boron nitride nanosheets comprise hydrogenated bilayered hexagonal boron nitride nanosheets.

Optionally, the display panel further comprises a protection layer which covers the OLED device layer, and the protection layer is made of a thermoplastic resin material.

Optionally, the thermoplastic resin material comprises at least one of polyolefin, polyamide, polycarbonate, polyoxymethylene, polyphenyleneoxide, chlorinated polyether, polyvinyl chloride, polysulfone, polyphenylene sulfide, polyetheretherketone and poly(acrylic acid).

Optionally, the material for the base layer further comprises a thermoplastic resin material, and the hydrogenated boron nitride nanosheets disperse in the thermoplastic resin material.

Optionally, the thermoplastic resin material comprises at least one of polyolefin, polyamide, polycarbonate, polyoxymethylene, polyphenyleneoxide, chlorinated polyether, polyvinyl chloride, polysulfone, polyphenylene sulfide, polyetheretherketone and poly(acrylic acid).

Another aspect of the disclosure provides a repairing method for the display panel as any one of the above which is cracked, comprising: matching and joining together cracked parts of the display panel; applying pressure to the base layer, making a lattice constant of the hydrogenated boron nitride nanosheets be compressed.

Optionally, said matching and joining together cracked parts of the display panel comprises: matching and joining together cracked parts of the display panel, making a plurality of the hydrogenated boron nitride nanosheets in the base layer where it has been cracked be correspondingly inter-attracted and connected together by hydrogen bond interaction.

Optionally, said applying pressure to the base layer, making a lattice constant of the hydrogenated boron nitride nanosheets be compressed comprises: by applying pressure to the base layer, making a lattice constant of the hydrogenated boron nitride nanosheets be compressed, changing a plurality of the hydrogenated boron nitride nanosheets in the base layer where it has been cracked from semiconductors into conductors.

Optionally, in a situation of the hydrogenated boron nitride nanosheets comprising hydrogenated bilayered hexagonal boron nitride nanosheets, said making a lattice constant of the hydrogenated boron nitride nanosheets be compressed comprises: making the lattice constant of the hydrogenated boron nitride nanosheets be compressed by about 7%~9%, such as 7%, 8%, 9% and so on.

Optionally, in a situation of the display panel further comprising a protection layer which covers the OLED device layer, and the protection layer is made of a thermoplastic resin material, the repairing method, after a step of said matching and joining cracked parts of the display panel together, further comprises: heat-treating a region of the protection layer which corresponds to a region where the cracked parts of the display panel are matched and joined together, making the protection layer where it has been cracked be connected together.

Optionally, the thermoplastic resin material comprises at least one of polyolefin, polyamide, polycarbonate, polyoxymethylene, polyphenyleneoxide, chlorinated polyether, polyvinyl chloride, polysulfone, polyphenylene sulfide, polyetheretherketone and poly(acrylic acid).

Optionally, in a situation of the thermoplastic resin material is polyolefin, said heat-treating comprises: heating to a temperature of about 80° C., and retaining the temperature for about 30 min.

Optionally, in a situation of the material for the base layer further comprising a thermoplastic resin material, and the hydrogenated boron nitride nanosheets dispersing in the thermoplastic resin material, the repairing method, after a step of said matching and joining cracked parts of the display panel together, further comprises: heat-treating a region of the base layer which corresponds to a region where the cracked parts of the display panel are matched and joined together, making the base layer where it has been cracked be connected together.

Optionally, the thermoplastic resin material comprises at least one of polyolefin, polyamide, polycarbonate, polyoxymethylene, polyphenyleneoxide, chlorinated polyether, polyvinyl chloride, polysulfone, polyphenylene sulfide, polyetheretherketone and poly(acrylic acid).

Optionally, in a situation of the thermoplastic resin material is polyolefin, said heat-treating comprises: heating to a temperature of about 80° C., and retaining the temperature for about 30 min.

BRIEF DESCRIPTION OF THE DRAWINGS

In order to describe technical solutions in embodiments of the present disclosure more clearly, the accompanying drawings to be used in the description of embodiments will be introduced briefly. Obviously, the accompanying drawings to be described below are merely a part of the embodiments of the present disclosure, and a person of ordinary skill in the art can obtain other drawings according to those drawings without paying any creative effort.

FIG. 1 is a structure diagram of a display panel provided in an embodiment of the present disclosure.

FIG. 2 is a diagram of equilibrium structures of six configurations of a surface-hydrogenated bilayered BN (with a lateral view in the middle, a top view in the left, a bottom view in the right, the B atom shown as a hollow ball, the N atom shown as solid ball, and the H atom shown as a small black ball for each equilibrium structure).

FIG. 3A is a diagram of distribution of charge density difference of AB-BN structure.

DETAILED DESCRIPTION

Figure 3B:
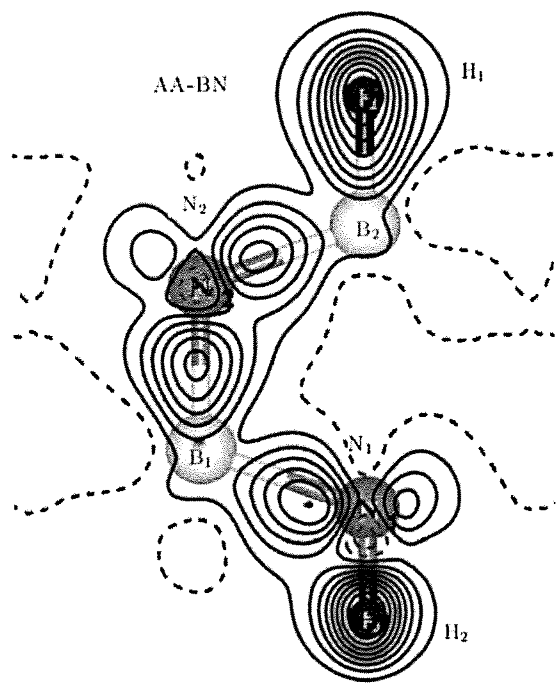
FIG. 3B is a diagram of distribution of charge density difference of AA-BN structure.

The technical solutions in the embodiments of the present disclosure will be described clearly and completely with reference to the accompanying drawings in the embodiments of the present disclosure. Obviously, the described embodiments are merely a part but not all of the embodiments of the present disclosure. All other embodiments made on the basis of the embodiments of the present disclosure by a person of ordinary skill in the art without paying any creative effort shall be included in the protection scope of the present disclosure.

It should be indicated that, unless otherwise defined, each term (including technical term or scientific term) used in the embodiments of the present disclosure has the same meaning as that persons of ordinary skills in the art commonly understand. It also should be understood that, each of the terms such as those defined in usual dictionaries should be interpreted as having the meaning consistent with that in the context of the relevant technology, rather than interpreted with an idealized meaning or an extremely formalized meaning, unless expressly defined like this herein.

For example, the word "include", "comprise" or the like used in the specification and claims of the present disclosure means that an element or object preceding the word covers listed elements or objects and their equivalents following the word, without excluding other elements or objects. The orientation or ubiety indicated by terms "on side", "the other side" or the like is an orientation or ubiety shown based on the accompanying drawings, and is merely for describing the present disclosure and simplifying the description rather than indicating or implying that the specified device or element must have a particular orientation or be constructed and operated in a particular orientation. Therefore, the terms should not be interpreted as limitations to the present disclosure.

In order to solve problems in the prior art, an embodiment of the present disclosure provides a display panel, and an embodiment of the present disclosure provides a repairing method thereof. The display panel, which has an OLED device layer positioned on a base layer which is constituted by hydrogenated boron nitride (BN) nanosheets, can recover circuits in cracked parts of an OLED device layer by treating the cracked parts using the structure characteristics of the nanosheets, so as to achieve the goal of repairing a cracked display panel and making it display properly.

After the display panel provided in an embodiment of the present disclosure is cracked, the cracked parts thereof are firstly joined together, and a plurality of the hydrogenated BN nanosheets of the base layer where it has been cracked are closely joined, taking advantage of interattraction of shared electrons of a hydrogen bond between surfaces of a plurality of the hydrogenated BN nanosheets. Next, the a plurality of the hydrogenated BN nanosheets are compressed, and a lattice constant thereof is compressed accordingly, such that conductivity of the plurality of the hydrogenated BN nanosheets increases, making structures such as a broken wiring on the OLED device layer where it has been cracked can re-conduct through the a plurality of the hydrogenated BN nanosheets which are beneath the OLED device layer and conductive. As a result, a circuit on the cracked region of the OLED device layer recovers, making the display panel be able to proceed with displaying.

An embodiment of the present disclosure provides a display panel 100 as shown in FIG. 1. The display panel 100 comprises base layer 10 and OLED device layer 20 which is positioned on the base layer 10. A material of the base layer 10 comprises hydrogenated boron nitride nanosheets.

It should be noted that, the foregoing "hydrogenated boron nitride nanosheet" means that a hydrogenated boron nitride nanosheet has a platy two-dimensional structure whose sizes of two dimensions are both in nanoscale. Specific ranges of the sizes can follow the prior art and are not limited herein.

The foregoing "OLED device layer" means a device layer comprising an OLED (Organic Light-Emitting Display) device and a circuit structure such as a relevant wiring or the like. Specific structure of the OLED device layer can follow the prior art and is not limited herein.

After the foregoing display panel is cracked, cracked parts thereof are matched and joined together. Then, a plurality of the BN nanosheets in a joining region are very close to each other. Shared electrons of a hydrogen bond between surfaces of the plurality of the BN nanosheets will be inter-attracted and makes the plurality of the BN nanosheets be closely joined. Hydrogenated BN of the BN nanosheets is a semiconductor material whose band gap is adjustable, with a layered structure. Carrier mobility of the hydrogenated BN is low in general state, so it is difficult to form a conductive material. However, the semiconductor material of hydrogenated BN has a characteristic that its band gap is adjustable. It means that the band gap can become wider in a situation of the structure being stretched, and can become narrower in a situation of the structure being compressed. That is, when a hydrogenated BN material is applied a pressure and is compressed accordingly, inside its structure, a stress (i.e., a force generated inside a material to resist an external force) is generated, so that a lattice constant is compressed and the band gap becomes narrower. Because the band gap becomes narrower, it is easier to generate an electron transition from a valence band, through the band gap, to a conduction band. Therefore, an electronic carrier mobility increases, and the hydrogenated BN material transforms from a semiconductor into a conductor with a metallic characteristic. Contrarily, when the hydrogenated BN material is applied a tension and is stretched accordingly, inside its structure, another stress is generated, so that the lattice constant is stretched and the band gap becomes wider. Because the band gap becomes wider, it is more difficult to generate the electron transition from the valence band, through the band gap, to the conduction band. As a result, the hydrogenated BN material transforms from a semiconductor into a non-conductive insulator.

Based on this, after the display panel with the foregoing structure is cracked or damaged the like (e.g., torn off), the cracked parts thereof are firstly joined together, and a plurality of the hydrogenated BN nanosheets are closely joined, taking advantage of interattraction of shared electrons of a hydrogen bond between surfaces of a plurality of the hydrogenated BN nanosheets. Next, the a plurality of the hydrogenated BN nanosheets are compressed, and a lattice constant thereof is compressed accordingly, such that conductivity of the a plurality of the hydrogenated BN nanosheets increases, making structures such as a broken wiring on the cracked region of the OLED device layer can re-conduct through the plurality of the hydrogenated BN nanosheets which are beneath the OLED device layer and conductive. As a result, a circuit on the cracked region of the OLED device layer recovers, as the cracked region being repaired and healed, so the display panel can proceed with displaying.

Specific display effect of the foregoing display panel after repaired relates to a specific structure (e.g., wirings as a gate line, a data line, and so on, and an electrode) on the cracked region of the OLED device layer, a length and a distribution of a crack, and is not limited herein.

The foregoing hydrogenated boron nitride nanosheets can, for example, comprise hydrogenated bilayered hexagonal (or hexagon) boron nitride nanosheets with a better characteristic.

For one of the hydrogenated bilayered hexagonal boron nitride nanosheets, when a lattice constant thereof is compressed under stress, in a situation of the symmetry of its primitive cell unchanged, a lattice constant in the X-Y plane changes while a lattice constant in the Z direction is free (i.e., with variability). Biaxial strain of the hydrogenated BN with a structure of bilayered atomic sheet can be achieved by changing the lattice constant α. Studying the two stablest configurations in bilayered hexagonal structures of the hydrogenate BN, i.e., AB-BN and AA-BN, it is found that the band gab can become wider under stretching and can become narrower under compression. In a strain process, its energy band structure keeps being a direct band gap. When the lattice constant is compressed by around 7~9%, such as 7%, 8%, 9%, etc., the two stablest configurations both transform from semiconducting into metallic. It can be seen that the band gap of a hydrogenated bilayered BN nanosheet can be continuously modulated by biaxial strain. Therefore, a broken circuit structure on the hydrogenated BN nanosheets can recover, taking advantage of this characteristic of the hydrogenated BN.

The specific structural principle of the foregoing hydrogenated bilayered BN nanosheet is described as follows.

A bilayered BN nanosheet which is not hydrogenated has a structure of a hexagonal BN (h-BN) structure. For bilayered BN, there are two important structures. One is head-to-head form arrangement (named H-type hereinafter) and the other is stagger form arrangement (named B-type hereinafter).

There are two subtypes of the H-type:

i) each B (or N) atom in the upper layer locates right above a B (or N) atom in the lower layer;

ii) each B (or N) atom in the upper layer locates right above an N (or B) atom in the lower layer.

There are three subtypes of the B-type:

i) each N atom in the upper layer locates right above an N atom in the lower layer, while each B atom in the upper layer locates right above the center of a hexagon in the lower layer;

ii) each B atom in the upper layer locates right above a B atom in the lower layer, while each N atom in the upper layer locates right above the center of a hexagon in the lower layer;

each N (or B) atom in the upper layer locates right above a B (or N) atom in the lower layer, while each B (or N) atom in the upper layer locates right above the center of a hexagon in the lower layer.

Based on the calculation of the above five configurations of the bilayered BN nanosheet which is not hydrogenated, there are only small differences among binding energy of the five configurations of the bilayered BN.

Next, the parameters of the bilayered BN nanosheet which is hydrogenated are shown in Table 1.

TABLE 1 average lattice constant α, average bond length $d_{B—N}$ in one layer, bond length of B—N, N—N or B—B between two layers, binding energy $|E_b|$ and band gap value $E_g$ of six configurations of a surfaced hydrogenated bilayered BN

| Configuration | | Lattice constant/nm | In one layer, average bond length $d_{B—N}$/nm | Between two layers, bond length of B—N, N—N or B—B/nm | Bond length of B—H or N—H/nm | Binding energy $|E_b|$/eV | Band gap $E_g$/eV |
|---|---|---|---|---|---|---|---|
| H-type | AA—B | 0.257 | 0.157 | 0.156(N—N) | 0.120(B—H) | 39.606 | 4.88 |
| | AA—BN | 0.258 | 0.159 | 0.152(B—N) | 0.103(N—H)0.120(B—H) | 41.266 | 1.31 |
| | AA—N | 0.258 | 0.158 | 0.176(B—B) | 0.104(B—H) | 40.710 | 2.31 |
| B-type | AB—B | 0.257 | 0.157 | 0.154(N—N) | 0.120(B—H) | 39.634 | 4.97 |
| | AB—BN | 0.258 | 0.159 | 0.150(B—N) | 0.103(N—H)0.120(B—H) | 41.321 | 1.40 |
| | AB—N | 0.258 | 0.158 | 0.175(B—B) | 0.104(N—H) | 40.666 | 2.41 |

Based on the consideration of structural simplification, an embodiment of the present disclosure is illustrated in only one hydrogenation situation. That is, in each surface of the bilayered BN, either B atoms or N atoms adsorb H atoms. In this situation, there are mainly six configurations of H-adsorption as follows. For the situation of H-type i, each B (or N) atom in each surface absorbs one H atom, forming a configuration of AA-B (or AA-N). For the situation of H-type ii, each B atom and each N atom respectively located in the two surfaces absorbs one H atom, i.e., each B atom in one surface absorbs one H atom, and each N atom in the other surface absorbs one H atom, forming a configuration of AA-BN. For the situation of B-type i, each B atom in the two surfaces adsorbs one H atom, forming a configuration of AB-B. For the situation of B-type ii, each N atom in the two surfaces adsorbs one H atom, forming a configuration of AB-N. For the situation of B-type iii, each B atom and each N atom respectively located in the two surfaces absorbs one H atom, i.e., each B atom in one surface absorbs one H atom, and each N atom in the other surface absorbs one H atom, forming a configuration of AB-BN. By sufficient structural relaxation (that is a phenomenon that an atomic arrangement inside a material structure changes slowly with time or under annealing or the like, and eventually changes into a stabler atomic arrangement), six stable configurations of the surfaced hydrogenated bilayered BN nanosheet are obtained as shown in FIG. 2.

Accordingly, the corresponding lattice constants, bond lengths, binding energies and band gaps of the six configurations of the surfaced hydrogenated bilayered BN after optimization are shown in Table 1.

With reference to FIG. 2, for each layer of BN structure, when each B (or N) atom absorbs one H atom on the surface, the two layers of the BN are no longer bound by interaction of van der Waals force, but by a strong bond of B-N (or B-B, N-N) that is formed. Accordingly, a previous flat atomic plane is twisted into a zigzag structure, and the interlayer space between the two layers of the bilayered BN greatly reduces. With reference to Table 1, regarding the matter of bond length, a bond length formed by an N atom absorbing an H atom is about 0.103 nm which is equal to a bond length, 0.103 nm, of NH of a dimer in free state; a bond length formed by an B atom absorbing an H atom is about 0.120 nm which is similar with a bond length, 0.123 nm, of BH of a dimer in free state. This shows that the H atom and the BN nanosheet can form a strong bond. Due to the absorption of H atom, the previous $sp^2$ hybridization between the B atom and the N atom in the plane structure of BN changes into $sp^3$ hybridization, making the interlayer space greatly reduce. Accordingly, between the two layers, the bond of B-N, B-B or N-N is formed. Among the bonds, the bond of B-N is the shortest (about 0.151 nm), the bond of B-B is the longest (about 0.176 nm), and the bond of N-N is in between (about 0.154 nm). Therefore, between the two layers of the material of the hydrogenated BN, the bond of B-N is the strongest bond, and the bond length of B-N between two layers is even shorter than that (about 0.159 nm) in one layer. The bond length of B-N between two layers in the AB-BN configuration is shorter than that in the AA-BN configuration, indicating that the AB-BN configuration is stabler than the AA-BN configuration. With reference to Table 1, regarding the binding energy, among the six configurations of 1-hydrogenated bilayered BN, two configurations, AB-BN and AA-BN, in which each B atom on one surface absorbs an H atom and each N atom on the other surface absorbs an H atom, the binding energy of the two are the largest (i.e., the stablest).

Further, formation energy of the foregoing hydrogenation system is defined as follows:

$$E_f = E_{coh}[2H-(BN)_2] - \{E_{coh}[(BN)_2] + E_{coh}(H_2)\},$$

wherein, $E_{coh}[2H-(BN)_2]$, $E_{coh}[(BN)_2]$ and $E_{coh}(H_2)$ are respectively binding energy of the hydrogenated bilayered BN nanosheet, the non-hydrogenated bilayered BN nanosheet and an hydrogen molecule (taking the binding energy of $H_2$ being 4.48 eV as a basis).

To further describe bonding characteristics of atoms in the material of the hydrogenated BN, distributions of charge density differences in AB-BN and AA-BN, the two stablest structures, are illustrated in FIGS. 3A and 3B. A plane given in each of FIGS. 3A and 3B is perpendicular to the two layers of BN, and all the six atoms are almost inside the plane. Evidently, charge distribution among atoms has apparent directivity. Charge of B-N is mainly concentrated between these two atoms, forming an image of a typical covalent bond and charge of H-B bond or H-N bond is mainly concentrated around the H atom. It means that H-B bond or H-N bond has an apparent peculiarity of ionic bond (comprising partial covalency). Thus, when this material is cut off or damaged, a hydrogen bond can fully recover at normal temperature and make the material healed.

Figure 4:
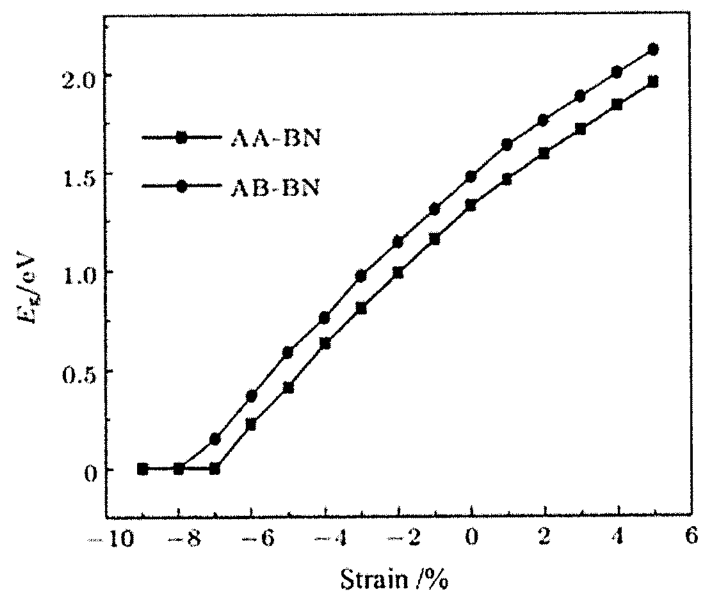
FIG. 4 is a diagram of the curve of changing of band gaps of hydrogenated bilayered BN nanosheets under stress.

To prove a property of the material of the hydrogenated BN under external stress, the biaxial strain of the hydrogenated bilayered BN atomic nanosheet is implemented by a simulation of changing the lattice constant (in a situation of the symmetry of its primitive cell unchanged, a lattice constant in the X-Y plane changes while a lattice constant in the Z direction is free). Studying the two stablest configurations of the hydrogenated bilayered BN nanosheet, it is found that the band gabs can become wider under stretching and can become narrower under compression. In a strain process, each energy band structure keeps being a direct band gap. When the lattice constants are compressed by around 8%, as shown in FIG. 4, both the two stablest configurations transform from semiconducting into metallic.

On the basis of the above, further to improve repairing effect of the display panel after cracked, as shown in FIG. 1, the foregoing display panel further comprises, a protection layer 30 which covers the OLED device layer 20, wherein the protection layer 30 is made of a thermoplastic resin material.

and/or, the material of the foregoing base layer 10 further comprises the thermoplastic resin material, and the hydrogenated BN nanosheets disperse in the thermoplastic resin material.

Regarding the latter situation of the hydrogenated BN nanosheets dispersing in the thermoplastic resin material, the specific doping ratio of the hydrogenated BN nanosheets can be flexibly adjusted according to structural parameters such as the size of the display panel, minimum bending radius and the like, and is not limited herein.

The thermoplastic resin material generally consists of linear macromolecular compounds, and a linear macromolecular compound is a long molecular chain consisting mainly of repeating units. The thermoplastic resin material has a characteristic of being able to melt and soften when heated and cure into its original state after cooled. When the thermoplastic resin material is cracked, among the long molecular chains, chains in the cracked region are broken or frizzled. After cracked parts is joined and heated, an average length of molecular chains in the heating region becomes shorter, and randomness continuously goes up. Previous apart chains have a new entanglement, making a crack-repairing region of the thermoplastic resin material which has been damaged become firmer. And the crack-repairing region will be cracked into parts only if a greater force is applied. Accordingly, a goal of repairing and stabilizing is achieved by the molecular chains in cracked sections of the thermoplastic resin material interpenetrating again and forming entanglement structure due to thermal motion.

That is, the foregoing thermoplastic resin material can be used as the protection layer covering the OLED device layer, and/or can be used as the base layer on which the OLED device layer is positioned. In each situation, an effect of repairing and reinforcing the foregoing display panel after cracked can be achieved.

The foregoing thermoplastic resin material can specifically comprise at least one of polyolefin (comprising at least one of polyethylene, polypropylene, polystyrene and polybutene), polyamide, polycarbonate, polyoxymethylene, polyphenyleneoxide, chlorinated polyether, polyvinyl chloride, polysulfone, polyphenylene sulfide, polyetheretherketone and poly(acrylic acid).

Figure 5:
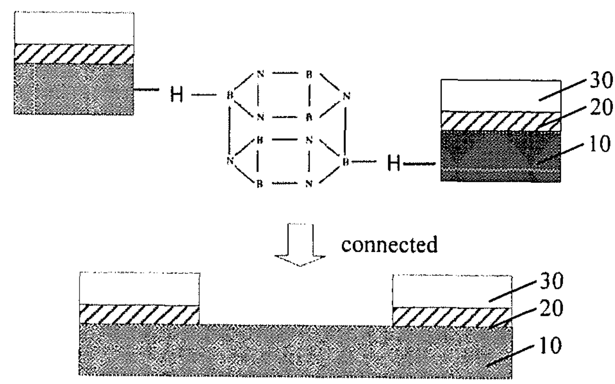
FIG. 5 is a first structure diagram of repairing a display panel provided by an embodiment of the disclosure.
Figure 6:
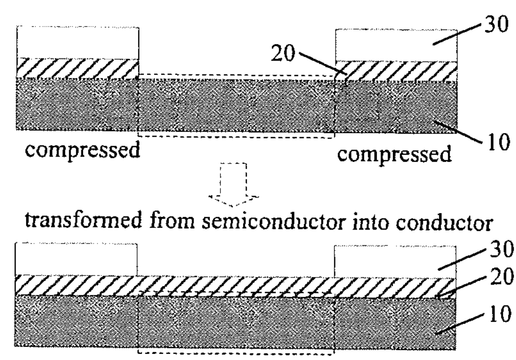
FIG. 6 is a second structure diagram of repairing a display panel provided by an embodiment of the disclosure.

On basis of the above, an embodiment of the present disclosure provides a repairing method for the display panel with the foregoing structures after cracked. The repairing method comprises:

S01, as shown in FIG. 5, matching and joining together the cracked parts of the display panel, forming a joining region.

accordingly, making a plurality of the hydrogenated boron nitride nanosheets in the base layer 10 where it has been cracked be correspondingly inter-attracted and connected together by hydrogen bond interaction;

S02, as shown in FIG. 6, applying pressure to the base layer, making a lattice constant of the hydrogenated boron nitride nanosheets be compressed by a preset value, accordingly, by applying pressure to the base layer, making a lattice constant of the hydrogenated boron nitride nanosheets be compressed, changing a plurality of the hydrogenated boron nitride nanosheets in the base layer 10 where it has been cracked from semiconductors into conductors, and making an open-circuit region of cracked parts of the OLED device layer be connected again, as the OLED device layer 20 is "repaired to be connected up".

It should be indicated that, in S02, in order to make a plurality of the hydrogenated boron nitride nanosheets of the base layer where it is cracked transform from semiconductors into conductors which can accordingly conduct an open-circuit structure like metal, a lattice constant of the plurality of the hydrogenated boron nitride nanosheets in the cracked region needs to be compressed.

Specific ways of compressing can include but are not limited to only applying pressure to the cracked region via relevant technical means making a lattice constant in the cracked region compressed, or compressing the whole base layer 10. In the latter situation, because only the cracked region of the whole base layer 10 is damaged, randomness of this region is largest, and the cracked region under compression from external force has a largest concentration of stress inside the material. Therefore, only the lattice constant in the cracked region of the hydrogenated BN nanosheets can be compressed significantly or sufficiently, causing a change from semiconducting into metallic.

In the situation of the hydrogenated boron nitride nanosheets comprising hydrogenated bilayered hexagonal boron nitride nanosheets, the preset value of compressing the lattice constant is about 7%~9%, such as 7%, 8%, 9% and so on. Such compression degree of the lattice constant can be quantitatively controlled by relevant instrument. Specific principle can be referred to the prior art, and is not elaborated herein.

Figure 7:
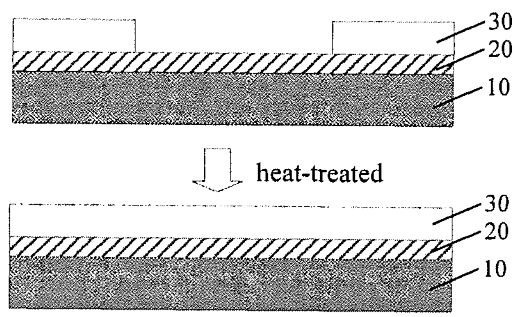
FIG. 7 is a third structure diagram of repairing a display panel provided by an embodiment of the disclosure.

On basis of the above, in the situation of the display panel further comprising the protection layer made of the thermoplastic resin material which covers the OLED device layer, the foregoing repairing method, after S01 above, further comprises:

S03, as shown in FIG. 7, heat-treating a region of the protection layer which corresponds to a region where the cracked parts of the display panel are matched and joined together, making the protection layer where it has been cracked be connected together.

FIG. 7 is for illustration, and S03 can be processed after or before S02 without limitation herein.

The foregoing thermoplastic resin material comprises at least one of polyolefin (comprising at least one of polyethylene, polypropylene, polystyrene and polybutene), polyamide, polycarbonate, polyoxymethylene, polyphenyleneoxide, chlorinated polyether, polyvinyl chloride, polysulfone, polyphenylene sulfide, polyetheretherketone and poly(acrylic acid).

When the foregoing thermoplastic resin material is polyolefin (like polypropylene), specific processes of heat-treating may comprise: heating to a temperature about 80° C., and retaining this temperature for about 30 min.

In the situation of the material for the foregoing base layer further comprising the thermoplastic resin material, and the hydrogenated boron nitride nanosheets dispersing in the thermoplastic resin material, the foregoing repairing method, after S01 above, further comprises:

heat-treating a region of the base layer which corresponds to a region where the cracked parts of the display panel are matched and joined together, making the base layer where it has been cracked be connected together. This step can be processed after or before S02 without limitation herein.

The foregoing thermoplastic resin material comprises at least one of polyolefin (comprising at least one of polyethylene, polypropylene, polystyrene and polybutene), polyamide, polycarbonate, polyoxymethylene, polyphenyleneoxide, chlorinated polyether, polyvinyl chloride, polysulfone, polyphenylene sulfide, polyetheretherketone and poly(acrylic acid).

When the foregoing thermoplastic resin material is polyolefin (like polypropylene), specific processes of heat-treating can comprise: heating to temperature of about 80° C., and retaining this temperature for about 30 min.

The foregoing descriptions merely show specific implementations of the present disclosure, and the protection scope of the present disclosure is not limited thereto. Any person of skill in the art can readily conceive of variations or replacements within the technical scope disclosed by the embodiments of the present disclosure, and these variations or replacements shall fall into the protection scope of the present disclosure. Accordingly, the protection scope of the present disclosure shall be subject to the protection scope of the claims.

Additional embodiments including any one of the embodiments described above may be provided by the disclosure, where one or more of its components, functionalities or structures is interchanged with, replaced by or augmented by one or more of the components, functionalities or structures of a different embodiment described above.

What is claimed is:

1. A display panel, comprising a base layer and an OLED device layer which is positioned on the base layer, wherein a material for the base layer comprises hydrogenated boron nitride nanosheets, and the hydrogenated boron nitride nanosheets are configured in such a way that, a lattice constant of the hydrogenated boron nitride nanosheets is compressed in response to a pressure applied to the hydrogenated boron nitride nanosheets.

2. The display panel according to claim 1, wherein the hydrogenated boron nitride nanosheets comprise hydrogenated bilayered hexagonal boron nitride nanosheets.

3. The display panel according to claim 1, wherein the display panel further comprises a protection layer which covers the OLED device layer, and the protection layer is made of a thermoplastic resin material.

4. The display panel according to claim 1, wherein the material for the base layer further comprises a thermoplastic resin material, and the hydrogenated boron nitride nanosheets disperse in the thermoplastic resin material.

5. The display panel according to claim 3, wherein the thermoplastic resin material comprises at least one of polyolefin, polyamide, polycarbonate, polyoxymethylene, polyphenyleneoxide, chlorinated polyether, polyvinyl chloride, polysulfone, polyphenylene sulfide, polyetheretherketone and poly(acrylic acid).

6. The display panel according to claim 4, wherein the thermoplastic resin material comprises at least one of polyolefin, polyamide, polycarbonate, polyoxymethylene, polyphenyleneoxide, chlorinated polyether, polyvinyl chloride, polysulfone, polyphenylene sulfide, polyetheretherketone and poly(acrylic acid).

7. A repairing method for the display panel according to claim 1 which is cracked, comprising:

matching and joining together cracked parts of the display panel;

applying pressure to the base layer, making a lattice constant of the hydrogenated boron nitride nanosheets be compressed.

8. The repairing method according to claim 7, wherein said matching and joining together cracked parts of the display panel comprises:

matching and joining together cracked parts of the display panel, making a plurality of the hydrogenated boron nitride nanosheets in the base layer where it has been cracked be correspondingly inter-attracted and connected together by hydrogen bond interaction.

9. The repairing method according to claim 7, wherein said applying pressure to the base layer, making a lattice constant of the hydrogenated boron nitride nanosheets be compressed comprises:

by applying pressure to the base layer, making a lattice constant of the hydrogenated boron nitride nanosheets be compressed, changing a plurality of the hydrogenated boron nitride nanosheets in the base layer where it has been cracked from semiconductors into conductors.

10. The repairing method according to claim 7, wherein in a situation of the hydrogenated boron nitride nanosheets comprising hydrogenated bilayered hexagonal boron nitride nanosheets, said making a lattice constant of the hydrogenated boron nitride nanosheets be compressed comprises:

making the lattice constant of the hydrogenated boron nitride nanosheets be compressed by about 7%~9%.

11. The repairing method according to claim 7, wherein in a situation of the display panel further comprising a protection layer which covers the OLED device layer and is made of a thermoplastic resin material, the repairing method, after the step of matching and joining together cracked parts of the display panel, further comprises:

heat-treating a region of the protection layer which corresponds to a region where the cracked parts of the display panel are matched and joined together, making the protection layer where it has been cracked be connected together.

12. The repairing method according to claim 11, wherein the thermoplastic resin material comprises at least one of polyolefin, polyamide, polycarbonate, polyoxymethylene, polyphenyleneoxide, chlorinated polyether, polyvinyl chloride, polysulfone, polyphenylene sulfide, polyetheretherketone and poly(acrylic acid).

13. The repairing method according to claim 11, wherein in a situation of the thermoplastic resin material is polyolefin, said heat-treating comprises: heating to a temperature of about 80° C., and retaining the temperature for about 30 min.

14. The repairing method according to claim 7, wherein in a situation of the material for the base layer further comprising a thermoplastic resin material, and the hydrogenated boron nitride nanosheets dispersing in the thermoplastic resin material, the repairing method, after the step of matching and joining together cracked parts of the display panel, further comprises: heat-treating a region of the base layer which corresponds to a region where the cracked parts of the display panel are matched and joined together, making the base layer where it has been cracked be connected together.

15. The repairing method according to claim 14, wherein the thermoplastic resin material comprises at least one of polyolefin, polyamide, polycarbonate, polyoxymethylene, polyphenyleneoxide, chlorinated polyether, polyvinyl chloride, polysulfone, polyphenylene sulfide, polyetheretherketone and poly(acrylic acid).

16. The repairing method according to claim 15, wherein in a situation of the thermoplastic resin material is polyolefin, said heat-treating comprises: heating to a temperature of about 80° C., and retaining the temperature for about 30 min.

17. A display panel, comprising a base layer and an OLED device layer which is positioned on the base layer, wherein a material for the base layer comprises hydrogenated boron nitride nanosheets, and the hydrogenated boron nitride nanosheets comprise hydrogenated bilayered hexagonal boron nitride nanosheets.

18. The display panel according to claim 17, wherein the display panel further comprises a protection layer which covers the OLED device layer, and the protection layer is made of a thermoplastic resin material.

19. The display panel according to claim 17, wherein the material for the base layer further comprises a thermoplastic resin material, and the hydrogenated boron nitride nanosheets disperse in the thermoplastic resin material.

20. The display panel according to claim 19, wherein the thermoplastic resin material comprises at least one of polyolefin, polyamide, polycarbonate, polyoxymethylene, polyphenyleneoxide, chlorinated polyether, polyvinyl chloride, polysulfone, polyphenylene sulfide, polyetheretherketone and poly(acrylic acid).

* * * * *